United States Patent
Lee et al.

(10) Patent No.: US 10,446,772 B2
(45) Date of Patent: Oct. 15, 2019

(54) ORGANIC SOLAR CELL AND METHOD OF MANUFACTURING THE SAME

(71) Applicant: LG CHEM, LTD., Seoul (KR)

(72) Inventors: Hangken Lee, Daejeon (KR); Jiehyun Seong, Daejeon (KR); Jaechol Lee, Daejeon (KR); Jeong Min Choi, Daejeon (KR); Songrim Jang, Daejeon (KR); Seung Heon Lee, Daejeon (KR); Song Ho Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 289 days.

(21) Appl. No.: 14/897,919

(22) PCT Filed: Jun. 13, 2014

(86) PCT No.: PCT/KR2014/005225
§ 371 (c)(1),
(2) Date: Dec. 11, 2015

(87) PCT Pub. No.: WO2014/200312
PCT Pub. Date: Dec. 18, 2014

(65) Prior Publication Data
US 2016/0141536 A1 May 19, 2016

(30) Foreign Application Priority Data
Jun. 14, 2013 (KR) .................. 10-2013-0068553

(51) Int. Cl.
*H01L 51/44* (2006.01)
*H01L 51/42* (2006.01)
*H01L 51/00* (2006.01)

(52) U.S. Cl.
CPC .......... *H01L 51/442* (2013.01); *H01L 51/445* (2013.01); *H01L 51/447* (2013.01); *H01L 51/0037* (2013.01); *H01L 51/4253* (2013.01); *H01L 2251/308* (2013.01); *Y02E 10/549* (2013.01); *Y02P 70/521* (2015.11)

(58) Field of Classification Search
CPC ............. H01L 2251/308; H01L 51/445; H01L 51/447
See application file for complete search history.

(56) References Cited

U.S. PATENT DOCUMENTS 7,638,807 B2    12/2009   Yukinobu
2001/0015221 A1  8/2001   Kubota et al.
(Continued)

FOREIGN PATENT DOCUMENTS

CN    102637826 A    8/2012
EP      2413371 A2   2/2012
(Continued)

OTHER PUBLICATIONS

Jin Young Kim et al.: "New Architecture for High-Efficiency Polymer Photovoltaic Cells Using Solution-Based Titanium Oxide as an Optical Spacer", Advanced Materials, Mar. 2006, vol. 18, pp. 572-576.
Seok-Soon Kim et al.: "Plasmon enhanced performance of organic solar cells using electrodeposited Ag nanoparticles", Applied Physics Letters 93, 073307, (2008).
(Continued)

*Primary Examiner* — Sadie White
(74) *Attorney, Agent, or Firm* — Dentons US LLP

(57) ABSTRACT

The present specification provides an organic solar cell and a method of manufacturing the same.

15 Claims, 5 Drawing Sheets

(56) References Cited

U.S. PATENT DOCUMENTS

| | | | | |
|---|---|---|---|---|
| 2006/0090791 | A1* | 5/2006 | Gaudiana | H01L 27/301 136/256 |
| 2006/0162770 | A1* | 7/2006 | Matsui | H01G 9/2031 136/263 |
| 2007/0079869 | A1* | 4/2007 | Yukinobu | H01G 9/2022 136/263 |
| 2007/0095389 | A1* | 5/2007 | Cho | H01G 9/2031 136/263 |
| 2008/0131993 | A1* | 6/2008 | Forrest | H01L 51/441 438/82 |
| 2008/0216894 | A1* | 9/2008 | Hammond | B82Y 20/00 136/263 |
| 2011/0209902 | A1 | 9/2011 | Tulloch et al. | |
| 2013/0221341 | A1* | 8/2013 | Iwabuchi | H01L 51/448 257/40 |

FOREIGN PATENT DOCUMENTS

| | | | |
|---|---|---|---|
| JP | 2000-243989 A | 9/2000 | |
| JP | 2009-505422 A | 2/2009 | |
| JP | 2010-232351 A | 10/2010 | |
| JP | 2011-159934 A | 8/2011 | |
| JP | WO 2012057011 A1 * | 5/2012 | ........... H01L 51/448 |
| JP | 2012-146420 A | 8/2012 | |
| WO | 2005/041217 A1 | 5/2006 | |
| WO | 2010/017590 A1 | 2/2010 | |

OTHER PUBLICATIONS

Jiawei Wan et al.: "The design and realization of large-scale patterned organic solar cells in series and parallel configurations", Solar Energy Materials & Solar Cells 101 (2012), pp. 289-294.

* cited by examiner

[Figure 1]
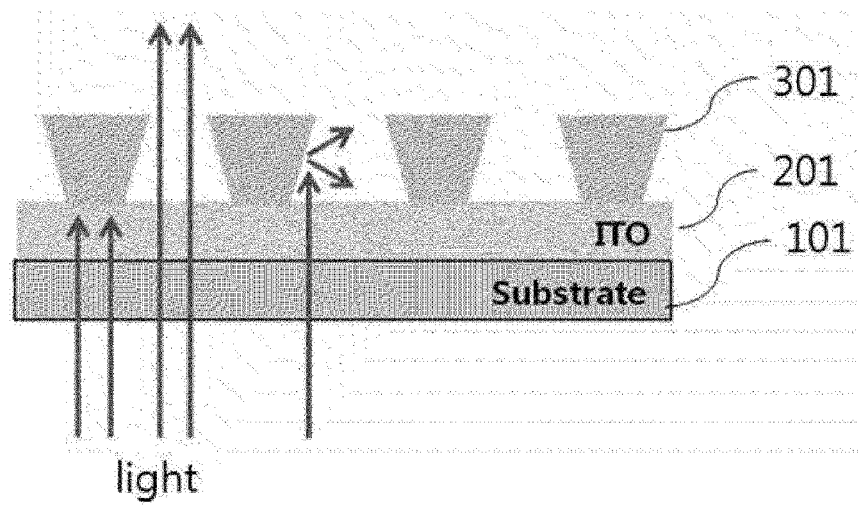
[Figure 2]
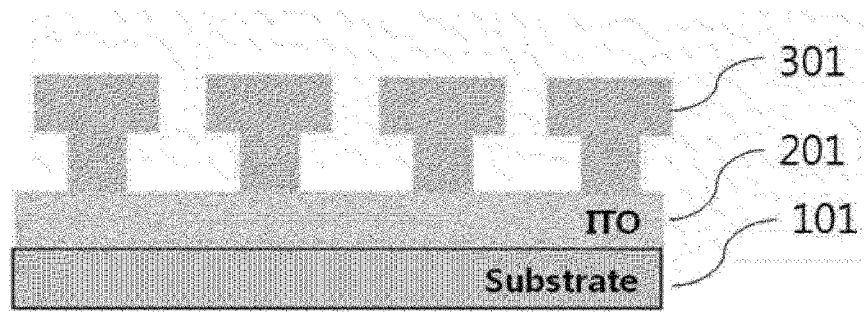
[Figure 3]
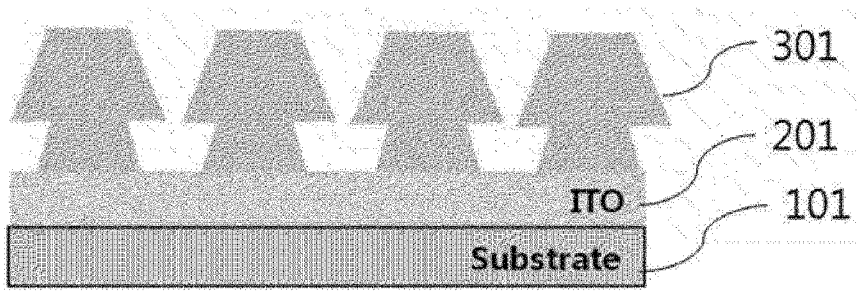

[Figure 4]
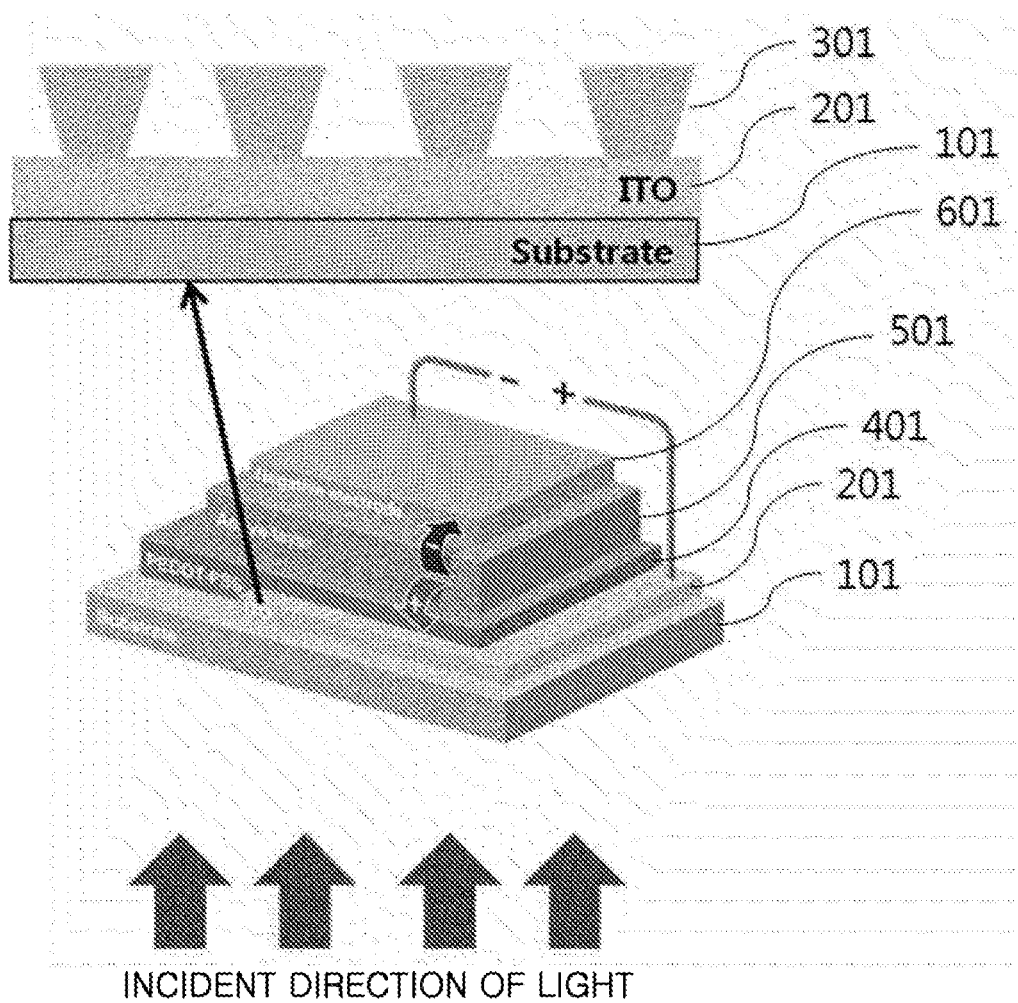
INCIDENT DIRECTION OF LIGHT

[Figure 5]
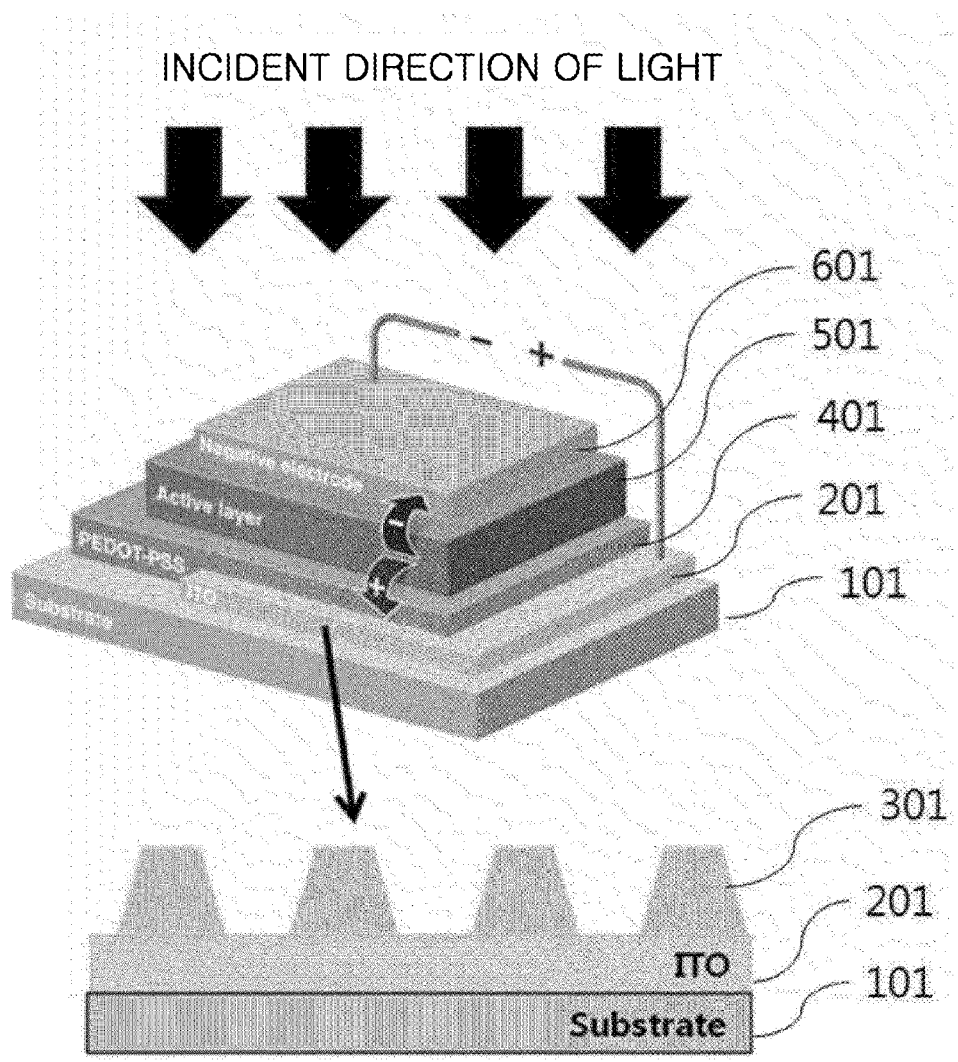

[Figure 6]
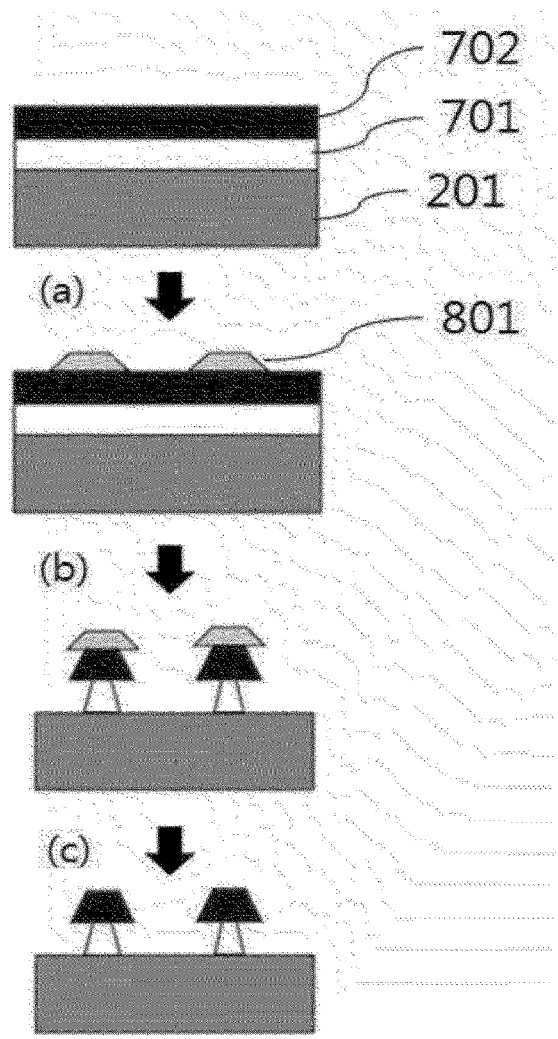
[Figure 7]
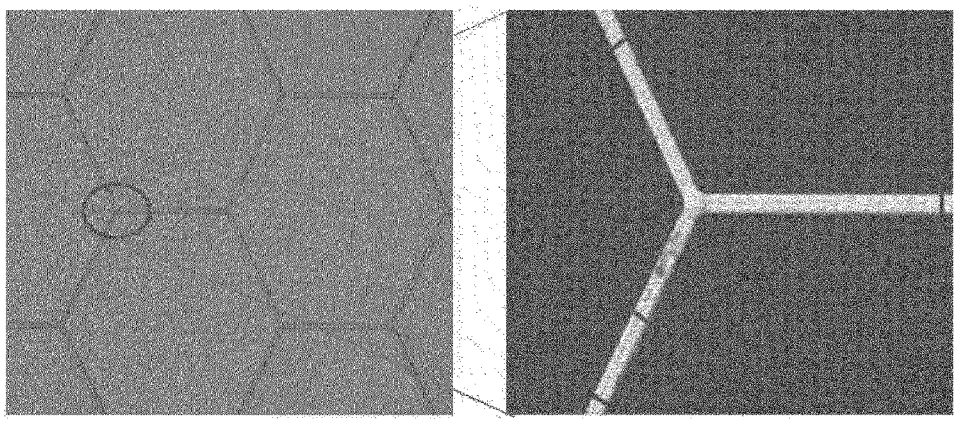

[Figure 8]
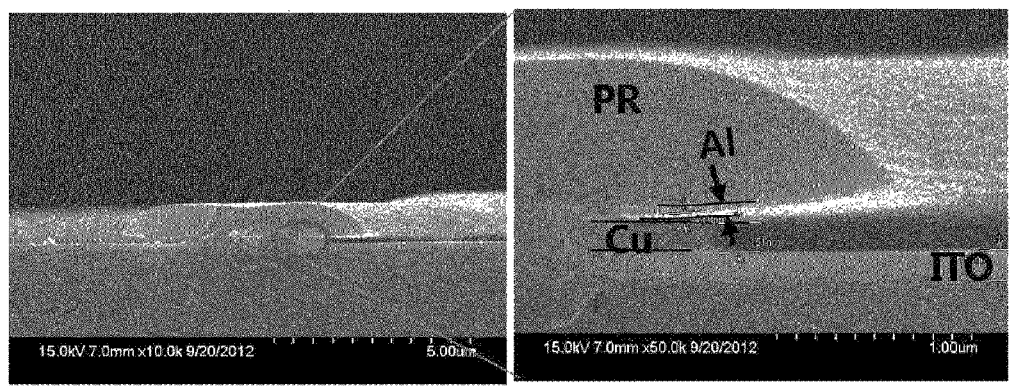

ORGANIC SOLAR CELL AND METHOD OF MANUFACTURING THE SAME

TECHNICAL FIELD

This application is a National Stage Entry of International Application No. PCT/KR2014/005225, filed Jun. 13, 2014, and claims the benefit of and priority to Korean Application No. 10-2013-0068553 filed in the Korean Intellectual Property Office on Jun. 14, 2013, both of which are incorporated herein by reference in their entirety for all purposes as if fully set forth herein.

The present specification relates to an organic solar cell and a method of manufacturing the same.

BACKGROUND ART

Due to a rapidly increased energy consumption amount and a limited reserve amount of an energy source, problems such as a rapid increase in fuel expenses and exhaustion of the energy source have reached a critical level. Further, together with this, regulations by individual countries on discharging of carbon dioxide have been further tightened. As a countermeasure on these problems, research for natural energy which is capable of being regenerated and is near inexhaustible, such as solar power, wind power, and water power which are clean and do not have a problem of exhaustion of resources, has been more actively made. Particularly, research for using solar power not largely restricted by a location, a position, and the like has come into the significant limelight.

Among methods using solar power as an energy source, recently, a solar cell has been most actively studied. The solar cell is a semiconductor device converting solar light into electricity by using a photovoltaic effect, and a solar cell using an inorganic semiconductor material such as a silicon or compound semiconductor has already come onto the market to be used. Further, recently, an organic solar cell using an organic material such as a polymer resin has been studied.

Light conversion efficiency of the organic solar cell is conversion efficiency of an incident light into electric energy, and refers to efficiency that the incident light excites an organic material in a photoactive layer to form an exciton that is a form where electrons and holes are unstably combined and the electrons and the holes pass through a donor layer and an acceptor layer, respectively, and move to an electrode to be converted into electric energy.

A material for the organic solar cell may be largely divided into a p-type organic semiconductor material that is a donor and an n-type organic semiconductor material that is an acceptor. If the exciton is generated by absorbing light, the p-type organic semiconductor material is the donor which may be divided into the holes and the electrons at a junction with the n-type organic semiconductor material to provide the electrons well. The n-type organic semiconductor material refers to a material which may be reduced into the acceptor to accept the electrons well. Various donor and acceptor materials have been reported, but it is difficult to expect efficiency of 3% or more except for P3HT/PCBM, PCPDTBT/PCBM, or the like.

One of the reasons why the organic solar cell has efficiency which is lower than that of the inorganic solar cell is because the organic solar cell has charge mobility that is much lower than that of the inorganic solar cell. For example, in the case where a thickness of the photoactive layer is increased in order to increase light absorption, due to a reduction in charge mobility and electric field, since re-combination of charges is increased, there is a limit in improving efficiency, and in the case where a large-area cell is manufactured in order to embody a module, due to an increase in resistance of a transparent electrode, an efficiency reduction (cell to module loss) significantly occurs. In order to solve the problems, a novel module structure using an optical spacer, metal nanoparticles, and the like, or minimizing electrode resistance has been proposed.

PRIOR ART DOCUMENT

Adv. Mater. 2006, 18, 572-576
Appl. Phys. Lett. 93, 073307 (2008)
Solar Energy Materials & Solar Cells 101 (2012) 289-294

DETAILED DESCRIPTION OF THE INVENTION

Technical Problem

The present specification has been made in an effort to provide an organic solar cell capable of increasing light conversion efficiency and a method of manufacturing the same.

Technical Solution

The present specification provides an organic solar cell including: a first electrode; a second electrode provided to face the first electrode; an organic material layer of one or more layers including a photoactive layer provided between the first electrode and the second electrode; and an auxiliary electrode provided to come into contact with the first electrode, in which in the auxiliary electrode, an area of a surface close to the first or second electrode which an incident light reaches is smaller than an area of a facing surface thereof.

Further, the present specification provides a method of manufacturing the organic solar cell. Specifically, there is provided a method of manufacturing the organic solar cell, the method including: preparing a substrate; forming a first electrode on the substrate; forming an auxiliary electrode on the first electrode; forming an organic material layer of one or more layers including a photoactive layer on the auxiliary electrode; and forming a second electrode on the organic material layer, in which areas of an upper surface and a lower surface of the auxiliary electrode are different from each other.

Advantageous Effects

An organic solar cell of the present specification has high light absorption efficiency by increasing a quantity of light reaching a photoactive layer.

Further, the organic solar cell of the present specification has high light absorption efficiency by enabling light to be re-absorbed.

Further, in the organic solar cell of the present specification, it is possible to embody a high fill factor when a large-area device is manufactured by reducing resistance of an electrode.

BRIEF DESCRIPTION OF DRAWINGS

FIGS. 1 to 3 illustrate a shape of an auxiliary electrode in an organic solar cell according to an exemplary embodiment of the present specification.

FIGS. 4 and 5 illustrate an example of the organic solar cell according to the exemplary embodiment of the present specification.

FIG. 6 illustrates a method of manufacturing an organic solar cell according to the exemplary embodiment of the present specification.

FIG. 7 is an optical microscope picture immediately after PR patterning is performed by a method of Preparation Example 1.

FIG. 8 is a SEM cross-sectional picture immediately after PR patterning and Cu/Al etching are performed by a method of Preparation Example 1.

BEST MODE

In the present specification, it will be understood that when an element is referred to as being positioned "on" another element, the element can be directly on the other element or intervening elements may also be present between the two elements.

In the present specification, unless explicitly described to the contrary, the word "comprise" and variations such as "comprises" or "comprising", will be understood to imply the inclusion of stated elements but not the exclusion of any other elements.

Hereinafter, the present specification will be described in more detail.

An exemplary embodiment of the present specification provides an organic solar cell including: a first electrode; a second electrode provided to face the first electrode; an organic material layer of one or more layers including a photoactive layer provided between the first electrode and the second electrode; and an auxiliary electrode provided to come into contact with the first electrode, in which in the auxiliary electrode, an area of a surface close to the first or second electrode which an incident light reaches is smaller than an area of a facing surface thereof.

The present inventors introduced the auxiliary electrode in order to solve a high resistance value of a transparent electrode, and developed the organic solar cell capable of increasing light absorption efficiency by adjusting a shape of the auxiliary electrode.

According to the exemplary embodiment of the present specification, the first electrode of the organic solar cell may be a transparent electrode for light absorption. However, the transparent electrode has a problem in that transmittance is high but electric conductivity is low. Therefore, according to the exemplary embodiment of the present specification, in order to compensate for low electric conductivity of the transparent electrode, the auxiliary electrode having high conductivity on the transparent electrode may be used.

According to the exemplary embodiment of the present specification, the auxiliary electrode may be made of a metal material for high electric conductivity, and in order to reduce a problem of a reduction in transmittance of light caused by this, an area of a surface close to an electrode which the incident light reaches may be smaller than an area of a facing surface thereof.

According to the exemplary embodiment of the present specification, in the organic solar cell, the incident light reaches the first electrode, and in the auxiliary electrode, an area of a surface coming into contact with the first electrode may be smaller than an area of a facing surface thereof. This case may mean the case where the first electrode is the transparent electrode and light is incident on the transparent electrode.

FIG. 1 illustrates the shape of the auxiliary electrode in the organic solar cell according to the exemplary embodiment of the present specification. Specifically, FIG. 1 illustrates an auxiliary electrode 301 provided on a first electrode 201 provided on a substrate 101. FIG. 1 illustrates a cross-section of the case where the auxiliary electrode is formed on the first electrode formed of ITO and light is transmitted. In FIG. 1, the arrow means light that is incident. Moreover, in FIG. 1, it can be seen that since the area of the auxiliary electrode on which the light is incident is small, more light may be transmitted through the first electrode, and the incident light may be reflected to a lateral surface of the auxiliary electrode to be re-absorbed into the photoactive layer. FIG. 1 illustrates only an effect in the case where light is incident in a vertical direction on the first electrode, but even in the case where light is incident in an incident direction that is not vertical, the same effect may be implemented.

Further, according to the exemplary embodiment of the present specification, light that is not absorbed into the photoactive layer but is reflected out from the second electrode may be re-reflected by the auxiliary electrode to be absorbed into the photoactive layer.

FIG. 4 illustrates an example of the organic solar cell according to the exemplary embodiment of the present specification. Specifically, FIG. 4 illustrates an organic solar cell where a first electrode 201, an auxiliary electrode 301, a hole transport layer 401, a photoactive layer 501, and a second electrode 601 are sequentially provided on a substrate 101. FIG. 4 illustrates a shape of a cross-section of the auxiliary electrode in the case where light is incident on the first electrode.

According to the exemplary embodiment of the present specification, in the organic solar cell, the incident light reaches the second electrode, and in the auxiliary electrode, an area of a surface coming into contact with the first electrode may be larger than an area of a facing surface thereof. This may be an organic solar cell of an inverted direction structure, in which the second electrode is the transparent electrode. That is, in the case where light is incident on the second electrode of the organic solar cell, in the auxiliary electrode, the area of the surface coming into contact with the first electrode may be larger than the area of the facing surface thereof. In this case, a residual light that is transmitted through the second electrode and is not absorbed in the photoactive layer may be reflected by the auxiliary electrode to be re-absorbed. Specifically, due to the auxiliary electrode, a quantity of light emitted to the first electrode may be reduced, and light may be re-absorbed to increase light absorption efficiency.

FIG. 5 illustrates an example of the organic solar cell according to the exemplary embodiment of the present specification. Specifically, FIG. 5 illustrates an organic solar cell where a first electrode 201, an auxiliary electrode 301, a hole transport layer 401, a photoactive layer 501, and a second electrode 601 are sequentially provided on a substrate 101. FIG. 5 illustrates a shape of a cross-section of the auxiliary electrode in the case where light is incident on the second electrode. That is, in FIG. 5, as compared to an area where a residual light transmitted through the second electrode and the photoactive layer is emitted through the first electrode, a reflection area of light by the auxiliary electrode is larger, and thus the residual light reflected by the auxiliary electrode may be re-absorbed into the photoactive layer.

Further, according to the exemplary embodiment of the present specification, in the organic solar cell, a direct light may be incident on the second electrode, and a residual light that is not absorbed into the photoactive layer may be reflected by the auxiliary electrode provided on the first electrode to be re-absorbed into the photoactive layer. In this case, since a reflection light having reduced light efficiency may be accessorily absorbed, efficiency of the organic solar cell may be further increased.

According to the exemplary embodiment of the present specification, a vertical cross-section of the auxiliary electrode may have a trapezoid shape. The vertical cross-section means a cross-section that is vertical to a wide surface of the first electrode by configuring the wide surface of the first electrode as a horizontal surface.

According to the exemplary embodiment of the present specification, in the auxiliary electrode, a ratio of line widths of an upper surface and a lower surface may be 1: 1.3 to 1:2 or 1.3:1 to 3:1.

The term "lower surface" may mean one surface of the auxiliary electrode closest to the first or second electrode which the incident light reaches, and the term "upper surface" may mean one surface of the auxiliary electrode, which faces the "lower surface" of the auxiliary electrode. Alternatively, the term "lower surface" may mean one surface of the auxiliary electrode positioned to be closest to the first electrode.

According to the exemplary embodiment of the present specification, the auxiliary electrode may be a metal electrode. Specifically, in the auxiliary electrode, generally, all kinds of metals may be used. Specifically, aluminum, copper, and/or silver having good conductivity may be included. In the case where in the auxiliary electrode, aluminum is used for adhesion force with the transparent electrode and stability in a photo process, a molybdenum/aluminum/molybdenum layer may be used. More specifically, the auxiliary electrode may include silver.

According to the exemplary embodiment of the present specification, the auxiliary electrode may be provided in a mesh structure. The mesh structure may be a network structure, and the mesh may have a shape of a polygon including a triangle, a quadrangle, and a honeycomb shape.

According to the exemplary embodiment of the present specification, the auxiliary electrode may be formed of two or more layers.

According to the exemplary embodiment of the present specification, in individual layers of the auxiliary electrode, an area of a surface close to the first or second electrode which the incident light reaches may be smaller than an area of a facing surface thereof.

According to the exemplary embodiment of the present specification, in the auxiliary electrode of two or more layers, an area of a surface closest to the first or second electrode which the incident light reaches may be smaller than an area of a facing surface thereof farthest away from the first or second electrode.

FIGS. 2 and 3 illustrate the shape of the auxiliary electrode in the organic solar cell according to the exemplary embodiment of the present specification.

Specifically, FIG. 2 illustrates the auxiliary electrode 301 provided on the first electrode 201 provided on the substrate 101. FIG. 2 illustrates the auxiliary electrode formed of two layers in the case where light is incident on ITO that is the first electrode. That is, like FIG. 2, in the case where the auxiliary electrode is formed, a quantity of light that is incident through the first electrode is increased, and the incident light is reflected to make re-absorption of light feasible.

Specifically, FIG. 3 illustrates the auxiliary electrode 301 provided on the first electrode 201 provided on the substrate 101. In FIG. 3, in the case where light is incident on ITO that is the first electrode, an incident quantity of light may be increased, and re-absorption due to reflection of the incident light is feasible. Moreover, there is a merit in that in the case of FIG. 3, in the case where light is incident on the second electrode, likewise, a great quantity of light may be reflected to be re-absorbed.

According to the exemplary embodiment of the present specification, shapes of vertical cross-sections of individual layers of the auxiliary electrode may be each independently a square, a rectangle, or a trapezoid.

According to the exemplary embodiment of the present specification, individual layers of the auxiliary electrode may be constituted by materials that are different from each other. Specifically, the auxiliary electrode coming into contact with the first electrode may be formed of copper, and the auxiliary electrode laminated thereon may be formed of silver.

According to the exemplary embodiment of the present specification, the first or second electrode which the incident light reaches may be the transparent electrode. Specifically, according to the exemplary embodiment of the present specification, the first electrode may be the transparent electrode.

According to the exemplary embodiment of the present specification, both the first and second electrodes may be the transparent electrode.

In the present specification, the term "transparent" may mean that transmittance of a visible ray is 30% or more, and specifically, in the present specification, the term "transparent" may mean that transmittance of the visible ray is 50% or more.

According to the exemplary embodiment of the present specification, the first electrode may be the transparent electrode, and the second electrode may be the metal electrode.

According to the exemplary embodiment of the present specification, the second electrode may be the metal electrode of 1 nm or more and 20 nm or less, or the transparent metal electrode.

According to the exemplary embodiment of the present specification, the organic solar cell may further include the substrate, and the first electrode may be provided on the substrate.

The substrate according to the present specification may be a glass substrate or a transparent plastic substrate having excellent transparency, surface flatness, easiness in handling, and water resistance, or a substrate where a light extraction layer is formed therein, but is not limited thereto, and there is no limitation as long as the substrate is a substrate generally used in the organic solar cell.

According to the exemplary embodiment of the present specification, the transparent electrode may be made of a transparent material having excellent conductivity, but is not limited thereto. Examples thereof include a metal such as vanadium, chrome, copper, zinc, and gold, or an alloy thereof; a metal oxide such as zinc oxide, indium oxide, indium tin oxide (ITO), and indium zinc oxide (IZO); a combination of a metal and an oxide, such as $ZnO:Al$ or $SnO_2:Sb$; a conductive polymer such as poly(3-methylthiophene), poly[3,4-(ethylene-1,2-dioxy)thiophene] (PEDOT), polypyrole, and polyaniline, and the like, but are not limited thereto.

Further, according to the exemplary embodiment of the present specification, the transparent electrode may include metal oxide/metal/metal oxide such as $MoO_2/Ag/MoO_3$, graphene, carbon nanotubes, metal nanoparticles, metal wires, metal meshes, and two or more complexes thereof.

According to the exemplary embodiment of the present specification, the transparent electrode may be a transparent conductive oxide layer. Specifically, as the transparent conductive oxide layer, in addition to glass and quartz plates, a matter where a material having conductivity is doped onto a flexible and transparent substrate such as a plastic including PET (polyethylene terephthalate), PEN (polyethylene naphthalate), PP (polypropylene), PI (polyimide), PC (polycarbonate), PS (polystyrene), POM (polyoxyethylene), an AS resin (acrylonitrile styrene copolymer), an ABS resin (acrylonitrile butadiene styrene copolymer), TAC (triacetyl cellulose), PAR (polyarylate), and the like may be used. More specifically, the transparent conductive oxide layer may be ITO (indium tin oxide), FTO (fluorine doped tin oxide), AZO (aluminum doped zinc oxide), IZO (indium zinc oxide), $ZnO-Ga_2O_3$, $ZnO-Al_2O_3$, ATO (antimony tin oxide), and the like, and even more specifically, the transparent conductive oxide layer may be ITO.

A method of forming the transparent electrode is not particularly limited, but for example, the transparent electrode may be formed by applying the material on one surface of the substrate or coating the material in a film form by using a sputtering, E-beam, heat deposition, spin coating, screen printing, inkjet printing, doctor blade, or gravure printing method.

In the case where the transparent electrode is formed on the substrate, the transparent electrode may be subjected to washing, water removing, and a hydrophilic reforming process.

For example, a patterned ITO substrate is sequentially washed by a cleaning agent, acetone, and isopropyl alcohol (IPA), and then dried on a hot plate at 100 to 150° C. for 1 to 30 minutes and preferably at 120° C. for 10 minutes in order to remove moisture, and if the substrate is completely washed, a surface of the substrate is subjected to hydrophilic reforming.

A conjunction surface potential may be maintained at a level suitable for a surface potential of the photoactive layer through the aforementioned surface reforming. Further, while reforming is performed, a polymer thin film may be easily formed on the transparent electrode, and the quality of the thin film may be improved.

Examples of a pre-treatment technology of the transparent electrode include a) a surface oxidizing method using parallel plate-type discharging, b) a method of oxidizing a surface through ozone generated by using ultraviolet rays in a vacuum state, c) a method of performing oxidizing by using oxygen radicals generated by a plasma, and the like.

Any one of the aforementioned methods may be selected according to a state of the transparent electrode or the substrate. However, whichever method is used, commonly, it is preferable to prevent leaving of oxygen from the surface of the transparent electrode or the substrate and maximally suppress staying of moisture and the organic material. In this case, a substantial effect of pre-treatment may be maximized.

As a specific example, the method of oxidizing the surface through ozone generated by using the ultraviolet rays may be used. In this case, after being washed by ultrasonic waves, the patterned ITO substrate may be baked on the hot plate to be well dried, and then put in a chamber, and a UV lamp may be operated to wash the patterned ITO substrate by ozone generated by reacting oxygen gas and the ultraviolet rays.

However, in the present specification, a method of reforming the surface of the patterned ITO substrate does not need to be particularly limited, and any method may be used as long as the method is a method of oxidizing the substrate.

The metal electrode may be made of a metal having a small work function, but is not limited thereto. Specifically, the metal electrode may be made of a metal such as magnesium, calcium, sodium, potassium, titanium, indium, yttrium, lithium, gadolinium, aluminum, silver, tin, and lead, or an alloy thereof; or a material of a multilayered structure, such as LiF/Al, $LiO_2$/Al, LiF/Fe, Al:Li, Al:$BaF_2$, and Al:$BaF_2$:Ba, but is not limited thereto. Specifically, according to the exemplary embodiment of the present specification, the metal electrode may include one kind or two or more kinds selected from the group consisting of silver (Ag), aluminum (Al), platinum (Pt), tungsten (W), copper (Cu), molybdenum (Mo), gold (Au), nickel (Ni), and palladium (Pd). Even more specifically, the metal electrode may be silver (Ag).

According to the exemplary embodiment of the present specification, the substrate may include one or more kinds selected from the group consisting of a glass, a polymer material, and a metal. Specifically, according to the exemplary embodiment of the present specification, the substrate may be the transparent substrate. Specifically, the transparent substrate may be made of a soda ash glass or transparent plastic, but is not limited thereto.

According to the exemplary embodiment of the present specification, the substrate may be a flexible substrate.

According to the exemplary embodiment of the present specification, the substrate may be a flexible substrate including a polymer material. Specifically, the substrate may be a substrate made of a plastic.

According to the exemplary embodiment of the present specification, the polymer material may include PI (polyimide), PC (polycarbonate), PES (polyethersulfone), PEEK (polyetheretherketone), PBT (polybutylene terephthalate), PET (polyethylene terephthalate), PVC (polyvinyl chloride), PE (polyethylene), an ethylene copolymer, PP (polypropylene), a propylene copolymer, TPX (poly(4-methyl-1-pentene)), PAR (polyarylate), POM (polyacetal), PPO (polyphenylene oxide), PSF (polysulfone), PPS (polyphenylene sulfide), PVDC (polyvinylidene chloride), PVAC (polyvinyl acetate), PVAL (polyvinyl alcohol), polyvinyl acetal, PS (polystyrene), an AS resin, an ABS resin, PMMA (polymethyl methacrylate), a fluorine resin, a PF (phenol) resin, a MF (melamine) resin, a UF (urea) resin, UP (unsaturated polyester), an EP (epoxy) resin, a DAP (diallyl phthalate) resin, PUR (polyurethane), PA (polyamide), a SI (silicon) resin, or a mixture and a compound thereof.

According to the exemplary embodiment of the present specification, the first electrode may be an anode, and the second electrode may be a cathode. Further, the first electrode may be the cathode, and the second electrode may be the anode.

According to the exemplary embodiment of the present specification, the organic solar cell may have an inverted structure. Specifically, the inverted structure means that the first electrode provided on the substrate is the cathode.

According to the exemplary embodiment of the present specification, the organic solar cell may have a normal structure. Specifically, the normal structure means that the first electrode provided on the substrate is the anode.

According to the exemplary embodiment of the present specification, the organic solar cell may further include a buffer layer of the second electrode provided between the photoactive layer and the second electrode. Specifically, according to the exemplary embodiment of the present specification, the buffer layer of the second electrode may be positioned between the metal electrode and the photoactive layer, and the buffer layer may control interfacial energy between the metal electrode and the photoactive layer to induce a smooth charge flow.

According to the exemplary embodiment of the present specification, the buffer layer of the second electrode may include a conductive polymer and/or a metal oxide. Specifically, as the conductive polymer, a conjugated polymer material, a dielectric polymer, a graphene carbon nanotube, a complex thereof, and the like are feasible. Specifically, the conjugated polymer material may be PEN (poly[(9,9-bis(30-(N,N-dimethylamino)propyl)-2,7-fluorene)-alt-2,7-(9,9-dioctylfluorene)]), FPQ-Br (poly[9,9'-bis[6"-(N,N,N-trimethylammonium) hexyl]fluorene-co-alt-phenylene]dibromide), and the like. Further, the dielectric polymer may be PEI (polyethylenimine), PEIE (polyethylenimine ethoxylated), and the like. Further, the conductive polymer may include one kind or two or more kinds selected from the group consisting of a phthalocyanine derivative, a naphthalocyanine derivative, an aromatic amine compound, polyethylenedioxythiophene (PEDOT:PSS), and polyaniline.

According to the exemplary embodiment of the present specification, the metal oxide included in the buffer layer of the second electrode may include $V_2O_5$ and/or $MoO_3$.

According to the exemplary embodiment of the present specification, the photoactive layer may have a bilayer structure including an n-type organic material layer and a p-type organic material layer.

According to the exemplary embodiment of the present specification, the photoactive layer may have a bulk heterojunction structure including an electron donor material and an electron acceptor material.

The photoactive layer of the bilayer structure may be formed of two layers of a p-type semiconductor thin film and an n-type semiconductor thin film as a p-n junction photoactive unit. Further, in the photoactive layer of the bulk heterojunction structure, an n-type semiconductor and a p-type semiconductor as a photoactive unit may be blended.

In the photoactive layer of the present specification, due to photo-excitation, the p-type semiconductor forms an exciton where a pair is formed by an electron and a hole, and the exciton is divided into the electron and the hole at a p-n junction. The divided electron and hole may move into the n-type semiconductor thin film and the p-type semiconductor thin film, respectively, and may be collected in the first electrode and the second electrode, respectively, to be used as electric energy in the outside.

In the exemplary embodiment of the present specification, the photoactive layer includes an electron donor material and an electron acceptor material as a photoactive material. In the present specification, the photoactive material may mean the electron donor material and the electron acceptor material.

In the photoactive layer, due to photo-excitation, the electron donor material forms the exciton where a pair is formed by the electron and the hole, and the exciton is divided into the electron and the hole at an interface of the electron donor and the electron acceptor. The divided electron and hole may move into the electron donor material and the electron acceptor material, respectively, and may be collected in the first electrode and the second electrode, respectively, to be used as electric energy in the outside.

According to the exemplary embodiment of the present specification, a mass ratio of the electron donor material and the electron acceptor material may be 1:10 to 10:1. Specifically, the mass ratio of the electron acceptor material and the electron donor material of the present specification may be 1:0.5 to 1:5.

In the photoactive layer of the present specification, an electron donating material and an electron accepting material may form BHJ (bulk heterojunction). The photoactive layer of the present specification may be annealed at 30 to 300° C. for 1 second to 24 hours in order to maximize a property after the electron donating material and the electron accepting material are mixed.

According to the exemplary embodiment of the present specification, the photoactive layer may include at least one kind of electron donor material and at least one kind of electron acceptor material.

According to the exemplary embodiment of the present specification, the photoactive layer may include at least two kinds of electron donor materials and at least one kind of electron acceptor material.

According to the exemplary embodiment of the present specification, the photoactive layer may include at least one kind of electron donor material and at least two kinds of electron acceptor materials.

According to the exemplary embodiment of the present specification, the electron donor material may include at least one kind of electron donor; or a polymer of at least one kind of electron acceptor and at least one kind of electron donor. The electron donating material may include at least one kind of electron donor. Further, the electron donor material may include a polymer of at least one kind of electron acceptor and at least one kind of electron donor.

According to the exemplary embodiment of the present specification, the electron donor material may be a copolymer including one or more kinds of a PPV (poly(phenylene vinylene))-based polymer or a P3HT (poly 3-hexylthiophene))-based polymer and monomers of the following structures.

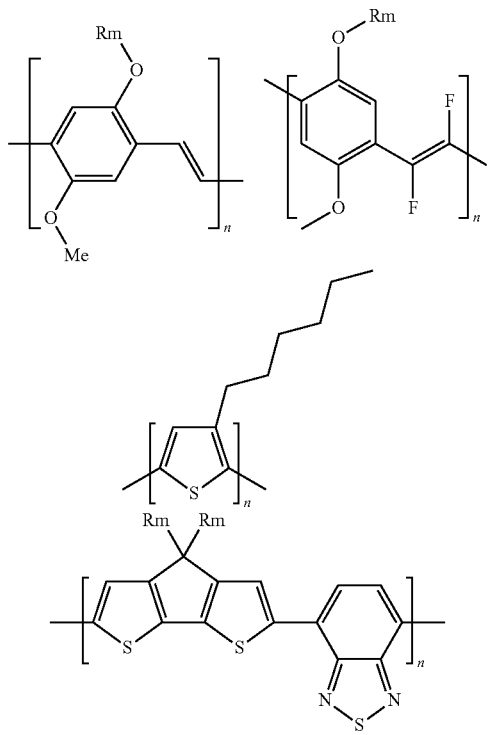

-continued

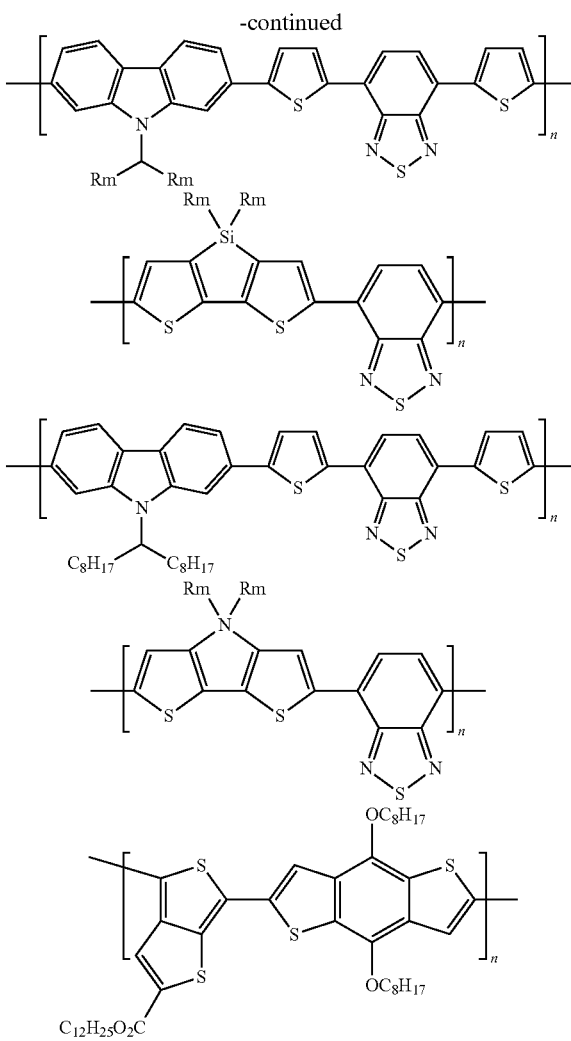

In the aforementioned compounds, n is an integer of 1 to 1,000,

Rm is hydrogen, a substituted or unsubstituted alkyl group; a substituted or unsubstituted cycloalkyl group; a substituted or unsubstituted alkoxy group; a substituted or unsubstituted alkenyl group; a substituted or unsubstituted aromatic or aliphatic heterocycle group including one or more of N, O, and S atoms, or a substituted or unsubstituted aryl group.

The electron donor materials are preferably materials having a small band gap so as to absorb an entire region of visible rays of the sunlight, and are generally a polymer compound, but are not limited thereto.

The electron donor material and the electron acceptor material are mixed at a ratio (w/w) of 1:10 to 10:1. After the electron donor material and the electron acceptor material are mixed, in order to maximize the property, the electron donor material and the electron acceptor material may be annealed at 30 to 300° C. for 1 second to 24 hours.

According to the exemplary embodiment of the present specification, a thickness of the photoactive layer may be 10 nm to 1,000 nm.

According to the exemplary embodiment of the present specification, the organic material layer may further include a light emitting layer and one kind or two or more kinds selected from the group consisting of a hole injection layer; a hole transport layer; a hole blocking layer; a charge generating layer; an electron blocking layer; an electron transport layer; and an electron injection layer.

The charge generating layer refers to a layer generating a hole and an electron if a voltage is applied.

Hole transport layer and/or electron transport layer materials serve to efficiently transport the electron and the hole separated from the photoactive layer to the electrode, and the materials are not particularly limited.

The hole transport layer material may be PEDOT:PSS (poly(3,4-ethylenediocythiophene) doped with poly(styrenesulfonic acid)), molybdenum oxide ($MoO_x$); vanadium oxide ($V_2O_5$); nickel oxide (NiO); tungsten oxide ($WO_x$), or the like, but is not limited thereto.

The electron transport layer material may be an electron-extracting metal oxide, and specifically, may be a metal complex of 8-hydroxyquinoline; a complex including $Alq_3$; a metal complex including Liq; LiF; Ca; titanium oxide ($TiO_x$); zinc oxide (ZnO); cesium carbonate ($Cs_2CO_3$), or the like, but is not limited thereto.

The photoactive layer may be formed by dissolving a photoactive material such as an electron donor and/or an electron acceptor in an organic solvent and then applying the solution by a method such as spin coating, dip coating, screen printing, spray coating, doctor blade, and brush painting, but the method is not limited thereto.

The exemplary embodiment of the present specification provides a method of manufacturing the organic solar cell. Specifically, there is provided a method of manufacturing the organic solar cell, the method including: preparing a substrate; forming a first electrode on the substrate; forming an auxiliary electrode on the first electrode; forming an organic material layer of one or more layers including a photoactive layer on the auxiliary electrode; and forming a second electrode on the organic material layer, in which areas of an upper surface and a lower surface of the auxiliary electrode are different from each other.

According to the exemplary embodiment of the present specification, the forming of the auxiliary electrode may be performed by using a transferring method or an etching method using an etchant.

According to the exemplary embodiment of the present specification, the etching method may include forming a metal layer on the first electrode, forming an etching protection layer on the metal layer, and etching the metal layer by the etchant.

According to the exemplary embodiment of the present specification, the metal layer may be two or more metal layers, and etching rates of the two or more metal layers to the etchant may be different from each other.

FIG. 6 illustrates a cross-section of the forming of the auxiliary electrode formed of two or more metal layers according to the exemplary embodiment of the present specification. Specifically, FIG. 6 illustrates a process of forming a first metal layer 701 and a second metal layer 702 on the first electrode 201, (a) forming an etching protection layer 801 on the second metal layer 702, (b) performing etching by using an etchant, and (c) stripping the etching protection layer 801.

According to the exemplary embodiment of the present specification, the method of manufacturing the organic solar cell may include preparing a substrate, forming an anode on the substrate, forming a hole transport layer on the anode, forming a photoactive layer on the hole transport layer, forming an electron transport layer on the photoactive layer, and forming a cathode on the electron transport layer.

Further, according to the exemplary embodiment of the present specification, the method of manufacturing the organic solar cell may include preparing a substrate, forming a cathode on an upper portion of the substrate, forming an electron transport layer on the cathode, forming a photoactive layer on the electron transport layer, forming a hole transport layer on the photoactive layer, and forming an anode on the hole transport layer.

The organic solar cell of the present specification, for example, may be manufactured by sequentially laminating the anode, the photoactive layer, and the cathode on the substrate.

For example, the organic solar cell according to the present invention may be manufactured by forming the anode by depositing a metal or a metal oxide having conductivity or an alloy thereof on the substrate by using a PVD (physical vapor deposition) method such as sputtering or e-beam evaporation, forming the organic material layer thereon by a vacuum deposition or solution coating method, and depositing a material capable of being used as a cathode thereon.

The organic material layer of the individual layer may be manufactured using various unimolecular or polymer materials by not a deposition method but a solvent process, for example, a method such as roll to roll, spin coating, dip coating, casting, roll court, flow coating, doctor blading, screen printing, inkjet printing, gravure printing, offset printing, spray coating, or a heat transferring method.

The organic material layer of the individual layer may be manufactured by a method such as a dry film forming method such as vacuum deposition, sputtering, plasma, and ion plating.

In the exemplary embodiment of the present specification, an anode deposition step, a photoactive layer lamination step, a photoactive layer alignment step, a photoactive layer heat treatment step, and a cathode deposition step may be included.

In the photoactive layer lamination step, the photoactive layer may be disposed in a complex thin film structure deposited by spraying a solution where an electron donor material and an electron acceptor material are mixed on an upper side of the anode, that is, bulk hetero junction.

As the electron acceptor material, a mixture solution where a complex polymer material is dissolved in an organic solvent may be used.

Hereinafter, the present specification will be specifically described in detail through Examples. However, the Examples according to the present specification may be modified in various other forms, and the scope of the present specification is not interpreted to be limited to the Examples described in detail below. The Examples of the present specification are provided so that a person with ordinary skill in the art may fully understand the present specification.

Preparation Example 1

On the glass/ITO/Cu/Al substrate where ITO, Cu, and Al were sequentially deposited in the thickness of 150 nm, 200 nm, and 30 nm, respectively, on the glass, the hexagonal mesh pattern having the line width of about 7 μm was formed by the photolithography method using the novolac-based positive photoresist (PR). Thereafter, after etching was performed by using the phosphoric acid/nitric acid/acetic acid-based etchant at 45° C. for 9 seconds, the shape was observed by the optical microscope, and the cross-section was observed by the scanning electron microscope (SEM). Thereafter, the novolac photoresist was removed by using the organic amine-based stripper to manufacture the transparent electrode including the ITO/inverse taper metal auxiliary electrode.

FIG. 7 is an optical microscope picture immediately after PR patterning is performed by the method of Preparation Example 1, and FIG. 8 is a SEM cross-sectional picture immediately after PR patterning and Cu/Al etching are performed by the method of Preparation Example 1. Referring to FIG. 8, it can be seen that since ITO is not etched but remains and the etching rate of Cu is faster than that of Al in the same etchant, Al is positioned at the lower portion of PR while about 7 μm that is the line width of PR is maintained, but since the etching rate of Cu is fast, additional etching occurs at the lower portion of Al, and thus the line width becomes very narrow.

Example 1

On the transparent electrode including the metal auxiliary electrode, in which the ratio of the line widths of the lower surface and the upper surface is 1:2, manufactured by the same method as Preparation Example 1, the PEDOT:PSS solution was applied, and heat treatment was then performed at 140° C. for 15 minutes. After the solution of P3HT and PCBM mixed at the ratio of 1:0.7 was applied on PEDOT:PSS to form the photoactive layer of about 220 nm, the Al electrode was deposited on the photoactive layer under $1\times10^{-7}$ torr, and then subjected to heat treatment at 150° C. for 10 minutes to manufacture the organic solar cell.

Example 2

On the transparent electrode including the metal auxiliary electrode, in which the ratio of the line widths of the lower surface and the upper surface is 1:3, manufactured by the same method as Preparation Example 1, the PEDOT:PSS solution was applied, and heat treatment was then performed at 140° C. for 15 minutes. After the solution of P3HT and PCBM mixed at the ratio of 1:0.7 was applied on PEDOT:PSS to form the photoactive layer of about 220 nm, the Al electrode was deposited on the photoactive layer under $1\times10^{7}$ torr, and then subjected to heat treatment at 150° C. for 10 minutes to manufacture the organic solar cell.

Comparative Example 1

The organic solar cell was manufactured by the same method as Example 1 while the auxiliary electrode was not formed.

Comparative Example 2

The organic solar cell was manufactured by the same method as Example 1, except that the metal electrode where the ratio of the line widths of the lower surface and the upper surface of the auxiliary electrode was 1:1 was provided.

Physical properties of the organic solar cells according to Examples 1 and 2 and Comparative Examples 1 and 2 were measured, and are arranged in the following Table 1.

TABLE 1

| Ratio of line widths of lower surface and upper surface of auxiliary electrode | $V_{oc}$ (V) | $J_{sc}$ (mA/cm$^2$) | FF | PCE (%) |
|---|---|---|---|---|
| Comparative Example 1 | | 0.62 | 9.41 | 0.51 | 2.99 |

TABLE 1-continued

| | Ratio of line widths of lower surface and upper surface of auxiliary electrode | $V_{oc}$ (V) | $J_{sc}$ (mA/cm$^2$) | FF | PCE (%) |
|---|---|---|---|---|---|
| Comparative Example 2 | 1:1 | 0.62 | 9.22 | 0.56 | 3.20 |
| Example 1 | 1:2 | 0.62 | 10.12 | 0.57 | 3.60 |
| Example 2 | 1:3 | 0.62 | 10.2 | 0.55 | 3.48 |

In the present specification, $V_{oc}$ means an open circuit voltage, $J_{sc}$ means a short-circuit current, FF means a fill factor, and PCE means energy conversion efficiency. The open-circuit voltage and the short-circuit current are respectively intercepts of X and Y axes in fourth quadrants of a voltage-current density curve, and as these two values are increased, efficiency of the solar cell is preferably increased. Further, the fill factor is a value obtained by dividing an area of a rectangle that may be drawn in the curve by the product of the short-circuit current and the open circuit voltage. If these three values are divided by the intensity of radiated light, energy conversion efficiency may be obtained, and the higher the value is, the better the efficiency is.

As seen in Table 1, it can be seen that in the organic solar cell according to the exemplary embodiment of the present specification, as compared to the case where there is no auxiliary electrode or the line widths of the upper and lower surfaces of the auxiliary electrode are the same as each other, excellent performance is embodied.

Example 3

The organic solar cell was manufactured by the same method as Example 1, and while the area of the photoactive layer was increased, properties of the reduction in resistance and the increase in light absorption caused by the auxiliary electrode where the ratio of the line widths of the lower surface and the upper surface of the auxiliary electrode was 1:2 were observed.

Physical properties of the organic solar cell according to Example 3 are described in the following Table 2.

TABLE 2

| | Area of photoactive layer (mm$^2$) | $V_{oc}$ (V) | $J_{sc}$ (mA/cm$^2$) | FF | PCE (%) |
|---|---|---|---|---|---|
| Example 3 | 43.6 | 0.62 | 10.12 | 0.57 | 3.60 |
| | 194 | 0.62 | 8.79 | 0.45 | 2.45 |
| | 287 | 0.62 | 7.4 | 0.43 | 1.97 |

Comparative Example 3

The organic solar cell was manufactured by the same method as Comparative Example 1, and while the area of the photoactive layer was increased, properties of the reduction in resistance and the increase in light absorption of the device not having the auxiliary electrode were observed.

Physical properties of the organic solar cell according to Comparative Example 3 are described in the following Table 3.

TABLE 3

| | Area of photoactive layer (mm$^2$) | $V_{oc}$ (V) | $J_{sc}$ (mA/cm$^2$) | FF | PCE (%) |
|---|---|---|---|---|---|
| Comparative Example 3 | 43.6 | 0.62 | 9.05 | 0.52 | 2.94 |
| | 194 | 0.62 | 7.99 | 0.29 | 1.43 |
| | 287 | 0.62 | 6.53 | 0.26 | 1.07 |

The organic solar cell was manufactured by the same method as Comparative Example 2, and while the area of the photoactive layer was increased, properties of the reduction in resistance and the increase in light absorption caused by the auxiliary electrode where the ratio of the line widths of the lower surface and the upper surface of the auxiliary electrode was 1:1 were observed.

Physical properties of the organic solar cell according to Comparative Example 4 are described in the following Table 4.

TABLE 4

| | Area of photoactive layer (mm$^2$) | $V_{oc}$ (V) | $J_{sc}$ (mA/cm$^2$) | FF | PCE (%) |
|---|---|---|---|---|---|
| Comparative Example 4 | 43.6 | 0.62 | 9.22 | 0.56 | 3.20 |
| | 194 | 0.62 | 8.05 | 0.40 | 2.10 |
| | 287 | 0.62 | 7.01 | 0.37 | 1.61 |

In the results of Tables 2 to 4, it can be seen that in the case where the area of the photoactive layer is increased, in the organic solar cell according to the exemplary embodiment of the present specification, the current density is increased due to the light re-absorption effect, and thus efficiency is higher.

DESCRIPTION OF REFERENCE NUMERALS

101: Substrate
201: First electrode
301: Auxiliary electrode
401: Hole transport layer
501: Photoactive layer
601: Second electrode
701: First metal layer
702: Second metal layer
801: Etching protection layer

The invention claimed is:
1. An organic solar cell comprising:
a first electrode;
a second electrode provided to face the first electrode;
an organic material layer of one or more layers including a photoactive layer provided between the first electrode and the second electrode; and
an auxiliary electrode formed of two or more planar metal layers and provided to come into contact with the first electrode,
wherein in the auxiliary electrode, the two or more planar metal layers are formed of different metals from each other having different etching rates to the same etchant, and
wherein in the auxiliary electrode, an area of a surface coming into contact with the first electrode which an incident light reaches is smaller than an area of a facing surface thereof.
2. The organic solar cell of claim 1, wherein the first or second electrode which the incident light reaches is a transparent electrode.

3. The organic solar cell of claim 1, wherein a vertical cross-section of the auxiliary electrode has a trapezoid shape.

4. The organic solar cell of claim 1, wherein in the auxiliary electrode, a ratio of line widths of an upper surface and a lower surface is 1:1.3 to 1:3 or 1.3:1 to 3:1.

5. The organic solar cell of claim 1, wherein the auxiliary electrode is provided in a mesh structure.

6. The organic solar cell of claim 1, wherein in individual layers of the auxiliary electrode, an area of a surface close to a first or second electrode which an incident light reaches is smaller than an area of a facing surface thereof.

7. The organic solar cell of claim 1, wherein in the auxiliary electrode of the two or more planar metal layers, an area of a surface closest to a first or second electrode which an incident light reaches is smaller than an area of a facing surface thereof farthest away from the first or second electrode.

8. The organic solar cell of claim 1, wherein shapes of vertical cross-sections of individual layers of the auxiliary electrode are each independently a square, a rectangle, or a trapezoid.

9. The organic solar cell of claim 1, wherein the photoactive layer has a bilayer structure including an n-type organic material layer and a p-type organic material layer.

10. The organic solar cell of claim 1, wherein the photoactive layer has a bulk heterojunction structure including an electron donor material and an electron acceptor material.

11. The organic solar cell of claim 1, wherein the organic material layer further includes a light emitting layer and one kind or two or more kinds selected from the group consisting of a hole injection layer; a hole transport layer; a hole blocking layer; a charge generating layer; an electron blocking layer; an electron transport layer; and an electron injection layer.

12. A method of manufacturing the organic solar cell of claim 1, the method comprising:
    preparing a substrate;
    forming a first electrode on the substrate;
    forming an auxiliary electrode on the first electrode;
    forming an organic material layer of one or more layers including a photoactive layer on the auxiliary electrode; and
    forming a second electrode on the organic material layer,
    wherein areas of an upper surface and a lower surface of the auxiliary electrode are different from each other, and
    wherein the auxiliary electrode is formed of two or more planar metal layers.

13. The method of claim 12, wherein the forming of the auxiliary electrode is performed by using a transferring method or an etching method using an etchant.

14. The method of claim 13, wherein the etching method includes forming two or more metal layers on the first electrode, forming an etching protection layer on the two or more metal layers, and etching the two or more metal layers by the etchant.

15. The method of claim 14, wherein etching rates of the two or more metal layers to the etchant are different from each other.

* * * * *